(12) United States Patent
Nakamura et al.

(10) Patent No.: US 8,253,033 B2
(45) Date of Patent: *Aug. 28, 2012

(54) CIRCUIT BOARD WITH CONNECTION LAYER WITH FILLET

(75) Inventors: Tadashi Nakamura, Osaka (JP); Takayuki Kita, Osaka (JP); Kota Fukasawa, Yamanashi (JP)

(73) Assignee: Panasonic Corporation, Osaka (JP)

( * ) Notice: Subject to any disclaimer, the term of this patent is extended or adjusted under 35 U.S.C. 154(b) by 348 days.

This patent is subject to a terminal disclaimer.

(21) Appl. No.: 12/514,383

(22) PCT Filed: Jul. 15, 2008

(86) PCT No.: PCT/JP2008/001891
§ 371 (c)(1),
(2), (4) Date: May 11, 2009

(87) PCT Pub. No.: WO2009/031262
PCT Pub. Date: Mar. 12, 2009

(65) Prior Publication Data
US 2010/0051337 A1  Mar. 4, 2010

(30) Foreign Application Priority Data

Sep. 3, 2007 (JP) ................ 2007-227735
Sep. 3, 2007 (JP) ................ 2007-227736
Sep. 3, 2007 (JP) ................ 2007-227737
Sep. 3, 2007 (JP) ................ 2007-227738
Sep. 3, 2007 (JP) ................ 2007-227739

(51) Int. Cl.
*H05K 1/11* (2006.01)

(52) U.S. Cl. .................................... 174/262

(58) Field of Classification Search .............. 174/262
See application file for complete search history.

(56) References Cited

U.S. PATENT DOCUMENTS 5,948,533 A * 9/1999 Gallagher et al. ........... 428/418

(Continued)

FOREIGN PATENT DOCUMENTS
EP       0 412 323 A2    2/1991
(Continued)

OTHER PUBLICATIONS

International Search Report for PCT/JP2008/001891 dated Oct. 28, 2008.

(Continued)

*Primary Examiner* — Timothy Thompson
*Assistant Examiner* — Nathan Milakovich
(74) *Attorney, Agent, or Firm* — RatnerPrestia

(57) ABSTRACT

A lower sub-board of a circuit board includes a first base layer having an upper surface, and a first wiring pattern provided on the upper surface of the first base layer. An upper sub-board of a circuit board includes a second base layer having a lower surface, and a second wiring pattern provided on the lower surface of the second base layer. A connection layer between lower and upper sub-boards includes an insulating layer having a lower surface and an upper surface, the lower surface of connection layer being situated on the upper surface of the first base layer, the upper surface of connection layer being situated on the lower surface of the second base layer, and a via-conductor passing through the insulating layer and connected to the first and second wiring patterns. This circuit board connects the sub-boards to each other via a via-conductor densely.

16 Claims, 15 Drawing Sheets

U.S. PATENT DOCUMENTS

| | | | |
|---|---|---|---|
| 6,140,402 A * | 10/2000 | Dietz et al. | 524/403 |
| 6,283,360 B1 | 9/2001 | Kumai et al. | |
| 6,437,450 B1 * | 8/2002 | Baba et al. | 257/778 |
| 6,586,822 B1 * | 7/2003 | Vu et al. | 257/678 |
| 6,798,072 B2 * | 9/2004 | Kajiwara et al. | 257/778 |
| 6,864,165 B1 * | 3/2005 | Pogge et al. | 438/612 |
| 2002/0053465 A1 * | 5/2002 | Kawakita et al. | 174/256 |
| 2002/0062919 A1 * | 5/2002 | Oxman et al. | 156/275.5 |
| 2002/0066961 A1 * | 6/2002 | Tomekawa et al. | 257/776 |
| 2004/0081764 A1 * | 4/2004 | Liu et al. | 427/376.1 |
| 2004/0142161 A1 * | 7/2004 | Kawakita et al. | 428/321.3 |
| 2004/0231151 A1 * | 11/2004 | Nakatani et al. | 29/830 |
| 2007/0013049 A1 * | 1/2007 | Asai et al. | 257/700 |
| 2008/0023815 A1 * | 1/2008 | Asai et al. | 257/687 |
| 2008/0023819 A1 * | 1/2008 | Chia et al. | 257/692 |
| 2008/0041615 A1 * | 2/2008 | Zhong et al. | 174/255 |
| 2008/0116562 A1 * | 5/2008 | Lien et al. | 257/690 |
| 2009/0169808 A1 | 7/2009 | Takano et al. | |
| 2010/0012362 A1 * | 1/2010 | Abe et al. | 174/259 |
| 2010/0170700 A1 * | 7/2010 | Nakamura et al. | 174/254 |

FOREIGN PATENT DOCUMENTS

| | | |
|---|---|---|
| EP | 0 831 528 A2 | 3/1998 |
| EP | 1 876 199 A1 | 1/2008 |
| EP | 2 157 838 A1 | 2/2010 |
| JP | 62-57387 | 9/1985 |
| JP | 6227387 U | 2/1987 |
| JP | 03-068149 A | 3/1991 |
| JP | 04-254826 A | 9/1992 |
| JP | 06-268345 A | 9/1994 |
| JP | 07-111379 A | 4/1995 |
| JP | 08-315946 A | 11/1996 |
| JP | 11067965 A | 3/1999 |
| JP | 11-154783 A | 6/1999 |
| JP | 2000-077457 A | 3/2000 |
| JP | 2001-244368 A | 9/2001 |
| JP | 2001-244368 A | 9/2001 |
| JP | 2002-208763 A | 7/2002 |
| JP | 2002-208763 A | 7/2002 |
| JP | 06-268345 A | 9/2004 |
| JP | 2004-253774 A | 9/2004 |
| JP | 2004-253774 A | 9/2004 |
| WO | WO 2006/118059 A1 | 11/2006 |

OTHER PUBLICATIONS

Supplementary European Search Report for Application No. EP 08 77 6850, Feb. 1, 2011, Panasonic Corporation.

Partial English Translation of JP Office Action Application No. 2007-227735 mailed Jan. 10, 2012.

Partial English Translation of JP Office Action Application No. 2007-227737 mailed Jan. 17, 2012.

Japanese Application No. 2007227735, Japanese Office Action mailed Jun. 12, 2012, 3 pgs., with partial English translation.

* cited by examiner ic cameras, and portable phones, have recently been used widely, and demanded to have small sizes, low profiles, light weights, higher resolution, and more functions. In order to
CIRCUIT BOARD WITH CONNECTION LAYER WITH FILLET THIS APPLICATION IS A U.S. NATIONAL PHASE APPLICATION OF PCT INTERNATIONAL APPLICATION PCT/JP2008/001891.

TECHNICAL FIELD

The present invention relates to a circuit board widely used for various electronic devices, such as personal computers, portable phones, and camcorders.

BACKGROUND ART

Portable products, such as personal computers, digital cameras, and portable phones, have recently been used widely, and demanded to have small sizes, low profiles, light weights, higher resolution, and more functions. In order to satisfy the demands, semiconductor devices have been had their packages having small sizes and low profiles and mounted in a solid or three-dimensional manner. In order to easily provide packages having low profiles and the three-dimensional mounting, a cavity board has been known.

FIG. 15 is a cross-sectional view of conventional circuit board 27 disclosed in Patent Documents 1 and 2. Lower sub-board 22 and upper sub-board 23 are stacked via connection layer 21 while electrodes and windows are positioned. Then, lower sub-board 22 and upper sub-board 23 are heated and pressed to be bonded to each other, thereby providing circuit board 27 having a recess in which an electronic component is accommodated. Connection layer 21 is made of, for example, mixture of thermosetting resin and inorganic filler.

In conventional circuit board 27, the process for stacking sub-boards 22 and 23 and connection layer 21 while heating and pressurizing sub-boards 22 and 23 and connection layer 21 decreases viscosity of the thermosetting resin included in connection layer 21 to allow the thermosetting resin to flow generally from the board to an outside of the board. Upon the thermosetting resin flowing, the inorganic filler of connection layer 21 flows together with the thermosetting resin. Thus, particles of the inorganic filler are extruded from connection layer 21. The extruded particles of the inorganic filler are attached onto and remain on a surface of board 27 as dust and foreign material. The remaining particles may drop after board 27 is completed, thereby contaminating the surface of board 27.

The inorganic filler itself does not have adhesiveness. If particles of the inorganic filler flow near an edge of connection layer 21, sub-boards 22 and 23 are not sufficiently adhered to connection layer 21, accordingly peeling sub-boards 22 and 23 from connection layer 21 or producing cracks.

The inorganic filler flowing from connection layer 21 reduces a thickness of the edge of connection layer 21, accordingly causing connection layer 21 to have a curved surface. Upper sub-board 23 is joined to connection layer 21 along the surface of connection layer 21 while warping, and thus, always receive an internal stress in a direction along which upper sub-board 23 is peeled from connection layer 21. This internal stress decreases adhesion strength between connection layer 21 and upper sub-board 23.

Connection layer 21 including the thermosetting resin has a temperature rising, melts, and cures, thereby adhering to sub-boards 22 and 23. The stress becomes zero at a temperature at which connection layer 21 adheres to sub-boards 22 and 23. Then, while connection layer 21 cools sub-boards 22 and 23, an internal stress is applied to connection layer 21 and sub-boards 22 and 23 since connection layer 21 and sub-boards 22 and 23 have different heat shrinkage amounts. This stress may cause completed circuit board 27 to warp.

Circuit boards have been demanded to have semiconductor devices, such as LSIs, mounted densely, to have multilayer structure inexpensively. In order to realize the circuit board having the multilayer structure, plural wiring patterns provided in different layers at fine pitches are electrically connected to each other reliably.

For the connection of layers formed with a fine pitch as described above, an inner-via-hole (IVH) structure disclosed in Patent Documents 3 and 4 are used instead of through-holes having inner walls and metal-plated conductors on the walls.

FIG. 16A is a cross-sectional view of conventional circuit board 501 having the IVH structure. Circuit board 501 includes insulating board 502 having through-hole 503, via-conductor 504 made of conductive paste filling through-hole 503, and wiring patterns 505 provided on both surfaces of insulating board 502. Via-conductor 504 connects wiring patterns 505 on both surfaces. This structure can locate via-conductor 504 beneath a land to be connected to a component, hence providing circuit board 501 with a small size and allows components to be mounted densely.

FIG. 16B is a cross-sectional view of conventional circuit board 501 which is pressurized. When circuit board 501 is pressurized while through-hole 503 filled with conductive paste, the diameter of through-hole 503 may increase in the vicinity of both surfaces of insulating board 502, and may cause the filled conductive paste to flow over both surfaces of insulating board 502, thus causing via-conductor 504 to deform. The flowing conductive paste prevents via-conductor 504 from being connected to wiring patterns 505 stably. The deformation of via-conductor 504 increases the diameter of via-conductor 504 at both surfaces of insulating board 502, thus preventing via-conductor 504 from being fine. In this case, wiring pattern 505 may not be arranged finely and densely.

Patent Document 1: JP 2004-253774A
Patent Document 2: JP 2001-244368A
Patent Document 3: JP 6-268345A
Patent Document 4: JP 2002-208763A

SUMMARY OF THE INVENTION

A circuit board includes a lower sub-board, a connection layer on the lower sub-board, and an upper sub-board on the connection layer. The lower sub-board includes a first base layer having an upper surface, and a first wiring pattern provided on the upper surface of the first base layer. The upper sub-board includes a second base layer having a lower surface, and a second wiring pattern provided on the lower surface of the second base layer. The connection layer includes an insulating layer having a lower surface and an upper surface, the lower surface of connection layer being situated on the upper surface of the first base layer, the upper surface of connection layer being situated on the lower surface of the second base layer, and a via-conductor passing through the insulating layer and connected to the first and second wiring patterns. The upper sub-board and the connection layer expose a portion of the upper surface of the lower sub-board. The insulating layer includes thermosetting resin, inorganic filler dispersed in the thermosetting resin, and elastomer dispersed in the thermosetting resin.

This circuit board connects the sub-boards to each other via a via-conductor densely.

REFERENCE NUMERALS

1 Upper Sub-Board
2 Lower Sub-Board
3 Connection Layer
7 Via-Conductor
10 Wiring Pattern (First Wiring Pattern)
11 Insulating Coating
12 Fillet Layer
33 Insulating Layer
33A Thermosetting Resin
33B Inorganic Filler
110 Wiring Pattern (Second Wiring Pattern)
111 Base Layer (Second Base Layer)
202 Insulating Layer
203 Through-Hole
204 Conductive Paste
205 Via-conductor
222 Base Layer (First Base Layer)
701 Thermosetting Resin
702 Inorganic Filler Detailed Description of Preferred Embodiments Exemplary Embodiment 1

Figure 1A:
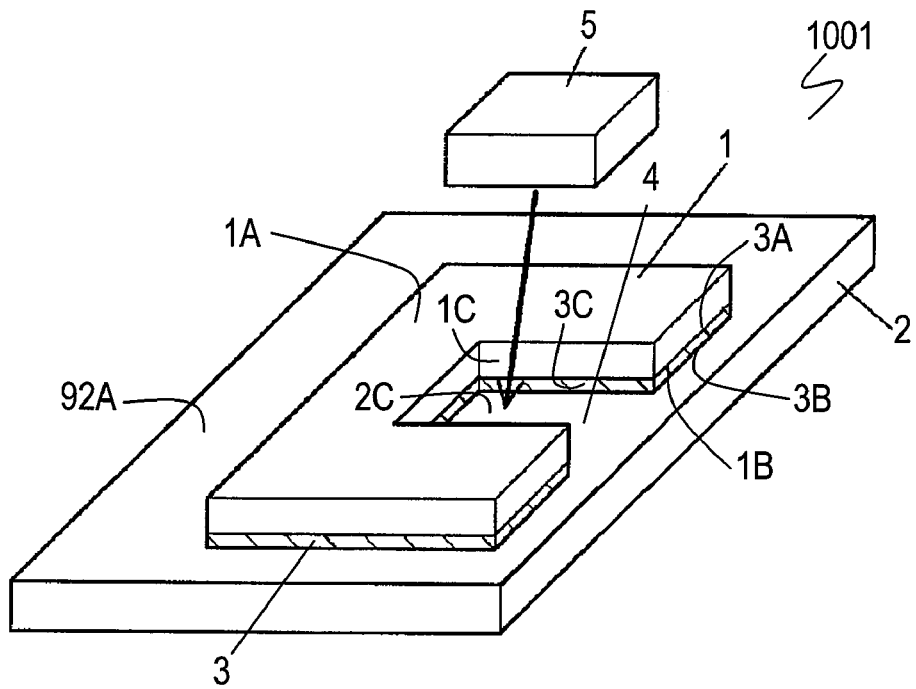
FIG. 1A is a perspective view of a circuit board according to Exemplary Embodiment 1 of the present invention.
Figure 1B:
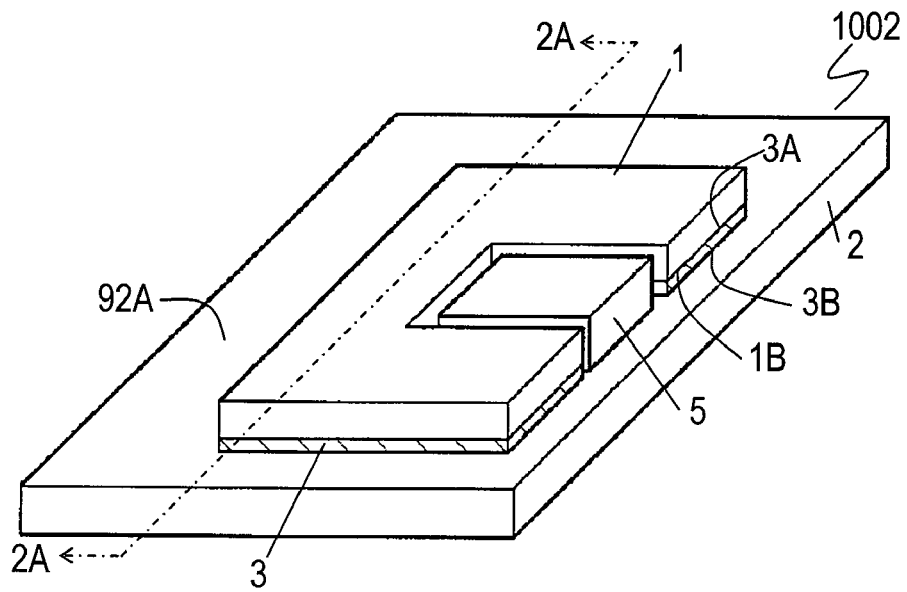
FIG. 1B is a perspective view of the circuit board according to Embodiment 1.

FIGS. 1A and 1B are perspective views of module 1002 including circuit board 1001 according to Exemplary Embodiment 1 of the present invention. Circuit board 1001 includes lower sub-board 2, connection layer 3 provided on upper surface 92A of lower sub-board 2, and upper sub-board 1 provided on upper surface 3A of connection layer 3. Lower surface 3B of connection layer 3 is situated on upper surface 92A of lower sub-board 2. Lower surface 1B of upper sub-board 1 is situated on upper surface 3A of connection layer 3. Upper sub-board 1 and lower sub-board 2 are made of insulating material, such as composite of glass woven fabric and epoxy-base resin. Lower surface 1B of upper sub-board 1 and upper surface 92A of lower sub-board 2 have wiring patterns provided thereon. Connection layer 3 has a uniform thickness on lower surface 1B of upper sub-board 1, and the thickness ranges from 30 to 300 µm. Upper sub-board 1 and lower sub-board 2 have shapes different from each other. Connection layer 3 positioned on lower surface 1B of upper sub-board 1 is provided on upper surface 92A so that portion 2C of upper surface 92A of lower sub-board 2 is exposed from connection layer 3. Recess 4 is formed straight above portion 2C of upper surface 92A of lower sub-board 2. Recess 4 is surrounded by portion 2C of upper surface 92A of lower sub-board 2, outer edge surface 3C of connection layer 3, and side edge surface 1C of upper sub-board 1. As shown in FIG. 1B, module 1002 includes circuit board 1001 and component 5 mounted on portion 2C of upper surface 92A of lower sub-board 2 of circuit board 1001. Component 5 is mounted in recess 4, and allows module 1002 to have a small thickness.

Figure 1C:
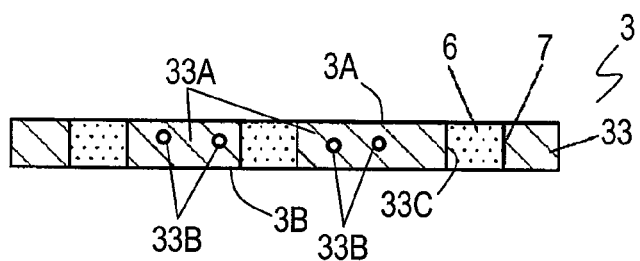
FIG. 1C is a cross-sectional view of a connection layer of the circuit board according to Embodiment 1.

FIG. 1C is a cross-sectional view of connection layer 3. Connection layer 3 includes insulating layer 33 having upper surface 3A and lower surface 3B and via-conductor 7 provided in insulating layer 33. Insulating layer 33 contains thermosetting resin 33A, such as epoxy resin, and inorganic filler 33B that is particles dispersed in the thermosetting resin. Insulating layer 33 has through-hole 33C therein communicating with upper surface 3A and lower surface 3B. Via-conductor 7 is made of conductive paste 6 filling through-hole 33C.

The inorganic filler in connection layer 3 is preferably made of at least one or more of silica, alumina, and barium titanate. The inorganic filler has a particle diameter ranging from 1 µm to 15 µm. The inorganic filler is contained at a percentage ranging from 70 weight % to 90 weight %. When the inorganic filler is contained at a contained amount smaller than 70%, the inorganic filler in insulating layer 33 is distributed thin in the thermosetting resin, and the inorganic filler also flows when the thermosetting resin flows during a pressing process. If the inorganic filler is included at a contained amount exceeding 90%, the amount of the thermoset resin is too small to allow the wiring patterns to be embedded in lower surface 1B of upper sub-board 1 and upper surface 92A of lower sub-board 2 and to allow connection layer 3 to adhere onto sub-boards 1 and 2.

Conductive paste 6 forming via-conductor 7 is preferably made of one of copper, silver, gold, palladium, bismuth, tin, and alloy thereof, and has a particle diameter ranging from 1 µm to 20 µm.

Figure 2A:
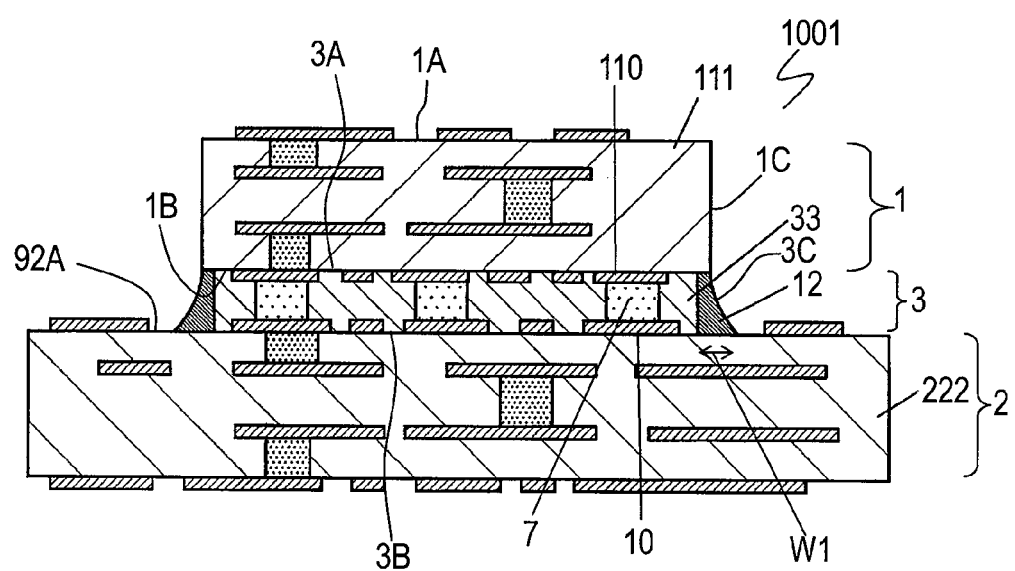
FIG. 2A is a cross-sectional view of the circuit board at line 2A-2A shown in FIG. 1B.

FIG. 2A is a cross-sectional view of circuit board 1001 at line 2A-2A shown in FIG. 1B. Upper sub-board 1 includes base layer 111 having upper surface 1A and lower surface 1B and wiring pattern 110 provided on lower surface 1B of base layer 111. Lower sub-board 2 includes base layer 222 having upper surface 92A and lower surface 2B and wiring pattern 10 provided on upper surface 92A of base layer 222. Via-conductor 7 (conductive paste 6) communicating with upper surface 3A and lower surface 3B of connection layer 3 (insulating layer 33) is connected to wiring pattern 110 and wiring pattern 10. Connection layer 3 includes fillet layer 12 that is provided at outer edge surface 3C and that is exposed from connection layer 3. A width of fillet layer 12 from outer edge surface 3C ranges from 10 µm to 100 µm. Fillet layer 12 made of only the thermosetting resin out of the thermosetting resin and the inorganic filler forming insulating layer 33, and does not include the inorganic filler. This structure prevents the particles of the inorganic filler from flowing out of connection layer 3, and thus, prevents the particles of the inorganic filler from being attached to or remaining or dropping on circuit board 1001, particularly on recess 4.

Fillet layer 12 that does not include the inorganic filler and that consists of the thermoset resin allows connection layer 3 to adhere securely onto upper sub-board 1 and lower sub-board 2, thus preventing peeling or a crack between connection layer 3 and upper sub-board 1 and between connection layer 3 and lower sub-board 2.

Connection layer 3 including insulating layer 33 and fillet layer 12 entirely has substantially a uniform thickness. Fillet layer 12 protrudes from upper sub-board 1. Fillet layer 12 of outer edge surface 3C of connection layer 3 is made of only the resin, and does not include the inorganic filler. This structure prevents the inorganic filler from flowing from outer edge surface 3C, and prevents connection layer 3 from having a thickness reduced near outer edge surface 3C, thus allowing connection layer 3 to have substantially a uniform thickness. Consequently, upper sub-board 1 does not warp and does not produce stress, thus not being peeled from connection layer 3.

Figure 2B:
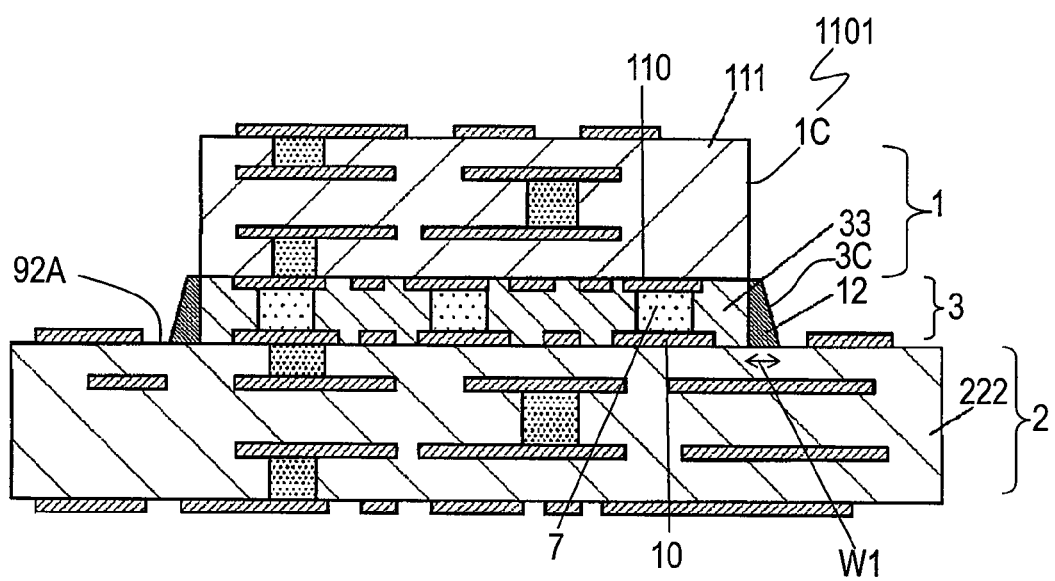
FIG. 2B is a cross-sectional view of another circuit board according to Embodiment 1.

FIG. 2B is a cross-sectional view of another circuit board 1101 according to Embodiment 1. In FIG. 2B, components identical to those of circuit board 1001 shown in FIG. 2A are denoted by the same reference numerals, and their description will be omitted. Connection layer 3 including insulating layer 33 and fillet layer 12 entirely has substantially s uniform thickness. Fillet layer 12 protrudes from upper sub-board 1. Fillet layer 12 of outer edge surface 3C of connection layer 3 is made of only the resin, and does not include the inorganic filler. This structure prevents the inorganic filler from flowing from outer edge surface 3C and prevents connection layer 3 from having a thickness reduced near edge surface 3C, thus allowing connection layer 3 to have substantially a uniform thickness. Consequently, upper sub-board 1 does not warp and does not produce stress, thus not being peeled from connection layer 3.

Next, a method of manufacturing circuit board 1001 will be described. FIGS. 3A to 3D, 4A to 4C, 5A, and 5B are cross-sectional views of circuit board 1001 for illustrating the method of manufacturing the circuit board.

Figure 3A:
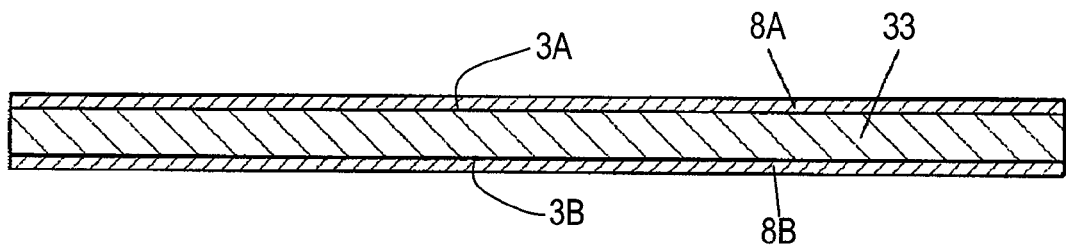
FIG. 3A is a cross-sectional view of the circuit board according to Embodiment 1 for illustrating a method of manufacturing the circuit board.
Figure 3B:
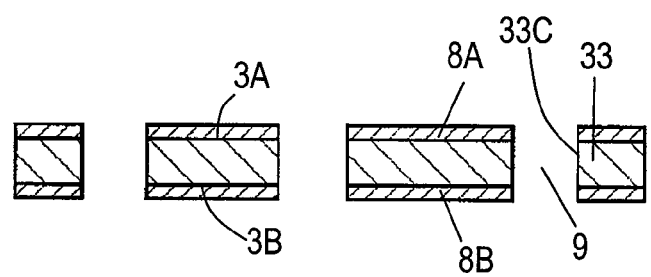
FIG. 3B is a cross-sectional view of the circuit board according to Embodiment 1 for illustrating the method of manufacturing the circuit board.
Figure 3C:
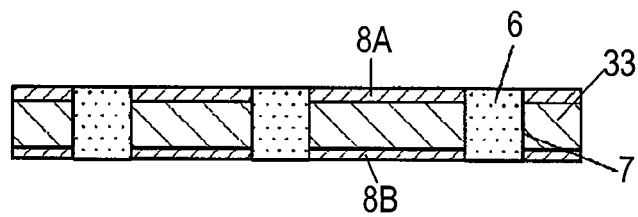
FIG. 3C is a cross-sectional view of the circuit board according to Embodiment 1 for illustrating the method of manufacturing the circuit board.
Figure 3D:
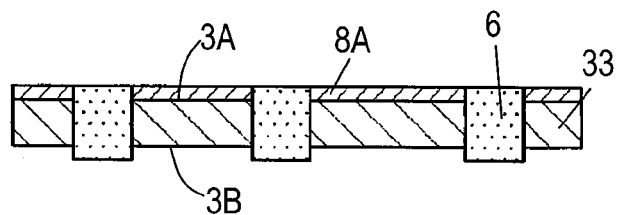
FIG. 3D is a cross-sectional view of the circuit board according to Embodiment 1 for illustrating the method of manufacturing the circuit board.

First, as shown in FIG. 3A, removable films 8A and 8B made of resin, such as polyethylene terephthalate (PET), are attached onto upper surface 3A and lower surface 3B of insulating layer 33 of connection layer 3, respectively. Next, as shown in FIG. 3B, insulating layer 33 is cut to have the shape of upper sub-board 1, and through-hole 9 (33C) is formed at a position at which upper sub-board 1 is connected to a wiring on lower sub-board 2. Next, as shown in FIG. 3C, conductive paste 6 including copper or copper alloy fills through-hole 9 to form via-conductor 7. Next, as shown in FIG. 3D, in order to adhere connection layer 3 onto lower sub-board 2, removable film 8B is peeled from insulating layer 33 while removable film 8A adheres onto upper surface 3A of insulating layer 33. Alternatively, in order to adhere connection layer 3 onto upper sub-board 1, removable film 8A may be peeled from insulating layer 33 while removable film 8B adheres onto lower surface 3B of insulating layer 33. If removable films 8A and 8B are peeled together, uncured connection layer 3 may easily break, thus preventing the circuit board from being handled easily.

Figure 4A:
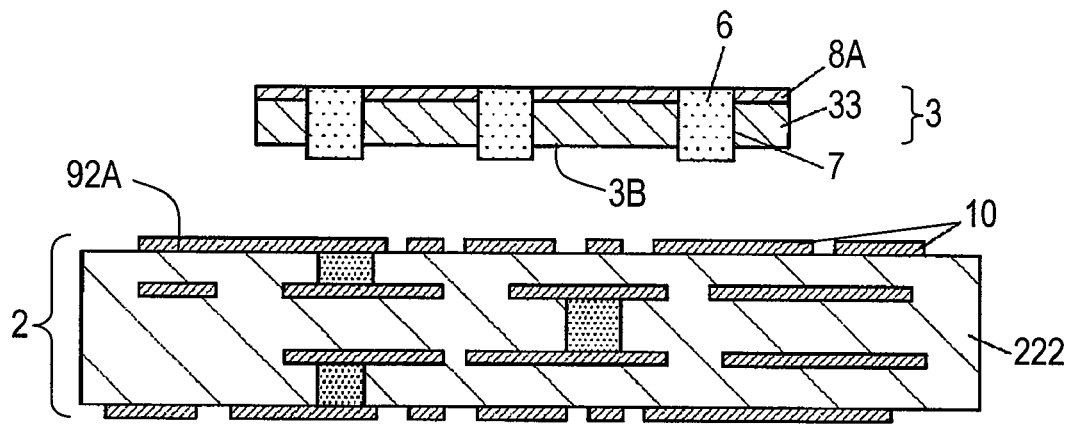
FIG. 4A is a cross-sectional view of the circuit board according to Embodiment 1 for illustrating the method of manufacturing the circuit board.
Figure 4B:
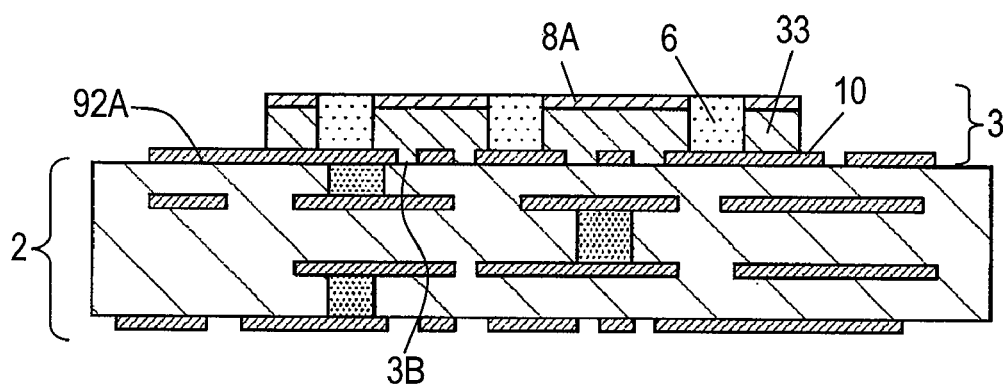
FIG. 4B is a cross-sectional view of the circuit board according to Embodiment 1 for illustrating the method of manufacturing the circuit board.
Figure 4C:
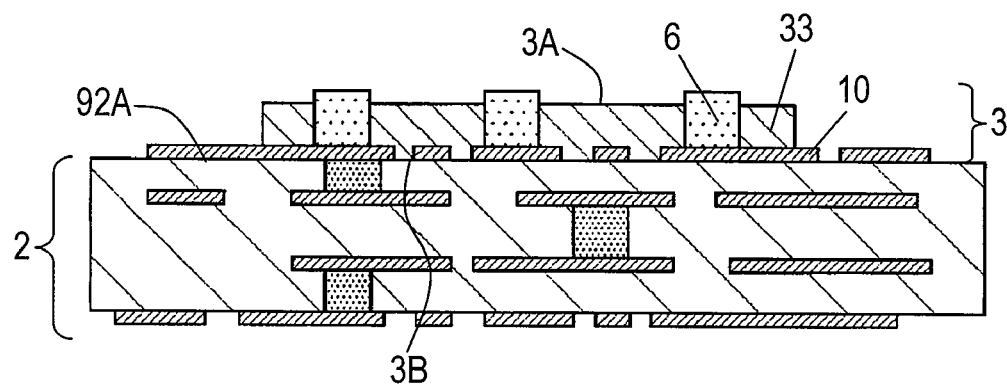
FIG. 4C is a cross-sectional view of the circuit board according to Embodiment 1 for illustrating the method of manufacturing the circuit board.

Next, as shown in FIG. 4A, connection layer 3 is placed on a predetermined position of upper surface 92A of lower sub-board 2. As shown in FIG. 4B, while conductive paste 6 is placed on wiring pattern 10 on upper surface 92A of lower sub-board 2, conductive paste 6 is heated and pressurized. This process embeds wiring pattern 10 in lower surface 3B of connection layer 3 (insulating layer 33), and further pressurizes conductive paste 6, thus connecting conductive paste 6 securely to wiring pattern 10. Then, as shown in FIG. 4C, removable film 8A provided on upper surface 3A of insulating layer 33 of connection layer 3 is peeled from upper surface 3A. At this moment, conductive paste 6 protrudes from upper surface 3A by a height equal to the thickness of removable film 8A.

Figure 5A:
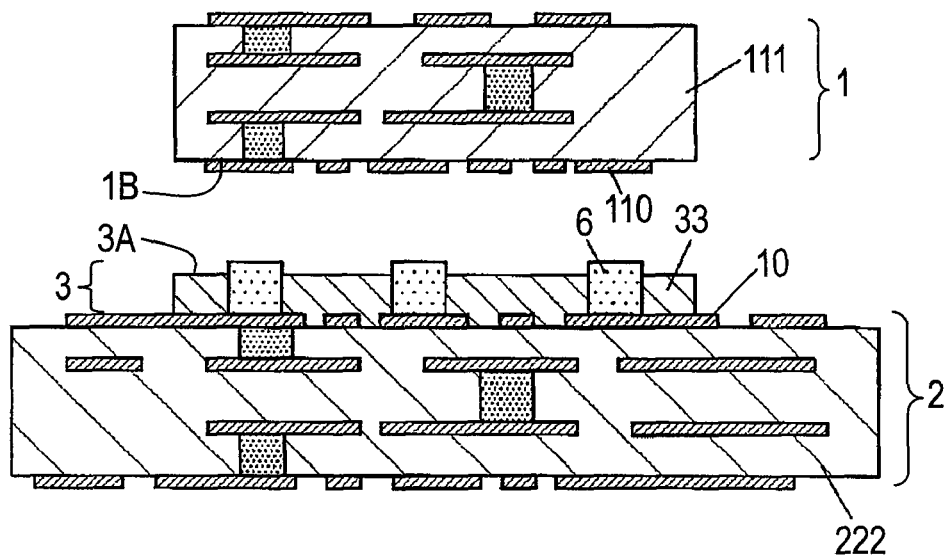
FIG. 5A is a cross-sectional view of the circuit board according to Embodiment 1 for illustrating the method of manufacturing the circuit board.
Figure 5B:
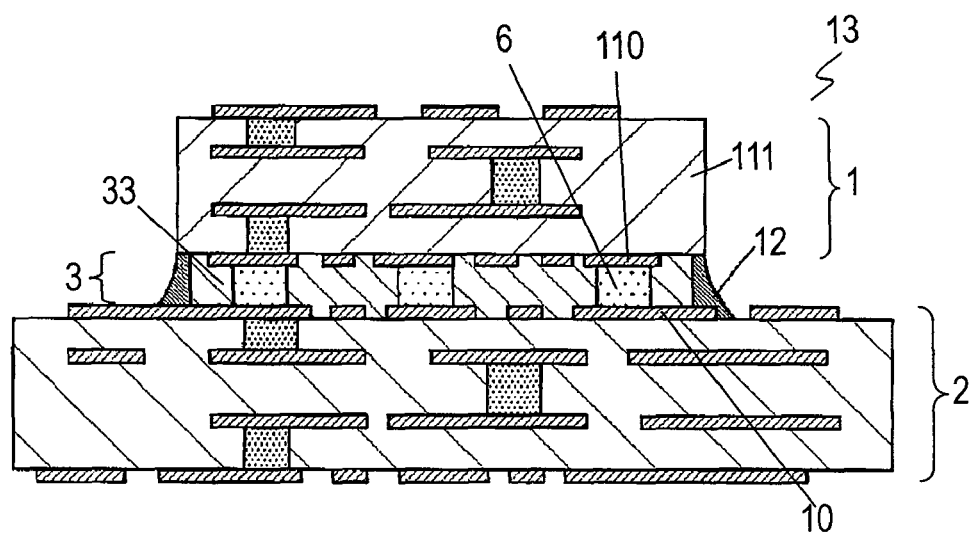
FIG. 5B is a cross-sectional view of the circuit board according to Embodiment 1 for illustrating the method of manufacturing the circuit board.

Next, as shown in FIG. 5A, upper sub-board 1 is provided on upper surface 3A of connection layer 3. As shown in FIG. 5B, while upper sub-board 1 is placed on upper surface 3A of connection layer 3, conductive paste 6 is heated and pressurized onto wiring pattern 110 provided on lower surface 1B of upper sub-board 1. This process embeds wiring pattern 110 in upper surface 3A of connection layer 3 (insulating layer 33), and further pressurizes conductive paste 6, thus connecting conductive paste 6 securely to wiring pattern 110. The heating and pressurizing causes insulating layer 33 of connection layer 3 to flow. Since insulating layer 33 includes the inorganic filler at a high density ranging from 70 to 90 weight %, the inorganic filler does not flow in insulating layer 33, and only thermosetting resin flows in insulating layer 33, thus forming fillet layer 12 that does not contain the inorganic filler and that includes only the thermosetting resin, thus providing circuit board 13.

Fillet layer 12 made of only the resin at the edge surface of connection layer 3 and having substantially a uniform thickness increases adhesiveness between upper sub-board 1, lower sub-board 2, and connection layer 3, thus preventing a crack or peeling between the layers. According to the present invention, fillet layer 12 has a width ranging from 10 to 100 μm, and is connected to connection layer 3 while having substantially a uniform thickness entirely.

As shown in FIG. 2A, insulating layer 33 of connection layer 3 and fillet layer 12 may have substantially uniform thicknesses identical to each other, and fillet layer 12 may protrude from upper sub-board 1. This structure can prevent upper sub-board 1 from warping. According to Embodiment 1, fillet layer 12 has a width ranging from 10 to 100 μm.

Figure 6A:
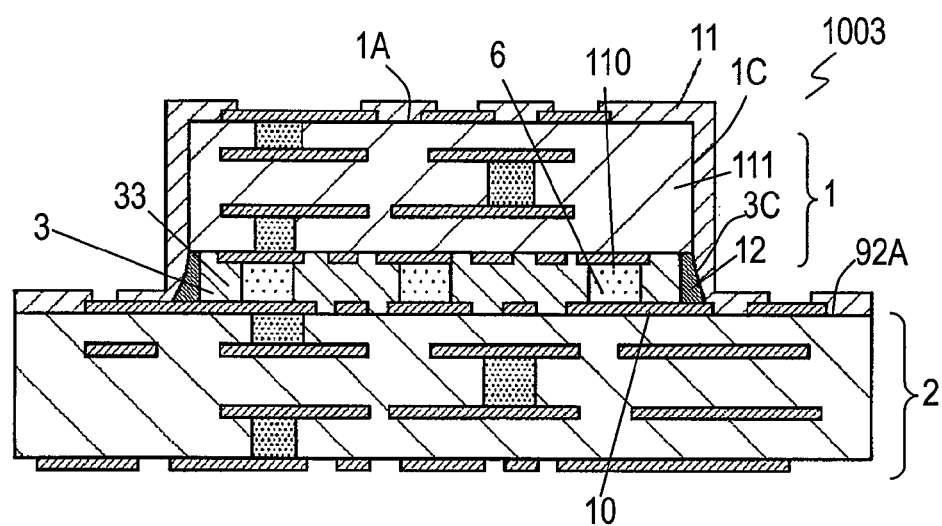
FIG. 6A is a cross-sectional view of the circuit board according to Embodiment 1 for illustrating the method of manufacturing the circuit board.

FIG. 6A is a cross-sectional view of further circuit board 1003 according to Embodiment 1. In FIG. 6A, components identical to those of circuit board 1001 shown in FIG. 2A are denoted by the same reference numerals, and their description will be omitted. Circuit board 1003 includes circuit board 1001 shown in FIG. 2A, and further includes insulating coating 11 made of insulating dry film having a thickness ranging from 5 μm to 30 μm. Insulating coating 11 covers upper surface 1A and side edge surface 1C of upper sub-board 1, upper surface 92A of lower sub-board 2, and outer edge surface 3C of connection layer 3. Insulating coating 11 may contain antistatic agent.

Figure 6B:
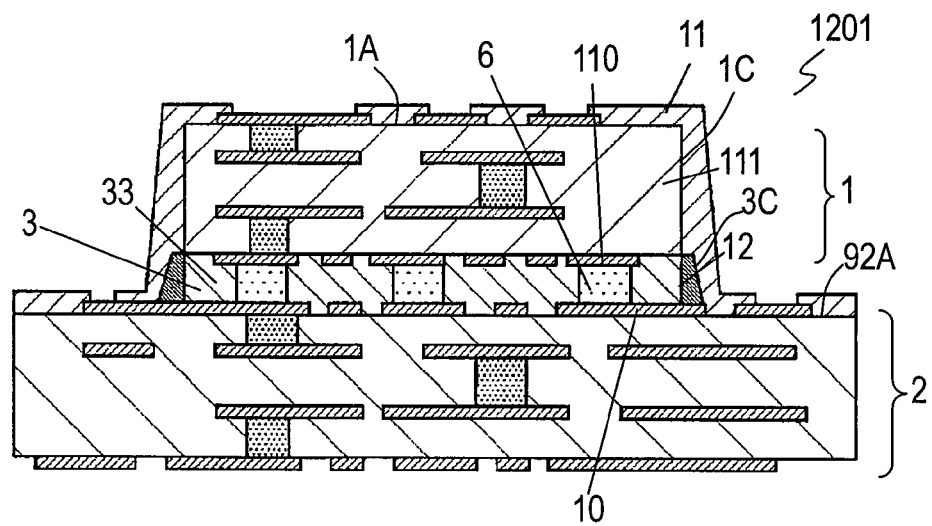
FIG. 6B is a cross-sectional view of the circuit board according to Embodiment 1 for illustrating the method of manufacturing the circuit board.

FIG. 6B is a cross-sectional view of further circuit board 1201 according to Embodiment 1. In FIG. 6B, components identical to those of circuit board 1001 shown in FIG. 2A are denoted by the same reference numerals, and their description will be omitted. Circuit board 1201 includes circuit board 1101 of FIG. 2B, and further includes insulating coating 11 made of insulating dry film having a thickness ranging from 5 μm to 30 μm. Insulating coating 11 covers upper surface 1A and side edge surface 1C of upper sub-board 1, upper surface 92A of lower sub-board 2, and outer edge surface 3C of connection layer 3. Insulating coating 11 may contain antistatic agent.

Dust, such as inorganic filler powders or powders of the material of the base layer, may come out of upper surface 1A of upper sub-board 1, side edge surface 1C, upper surface 92A of lower sub-board 2, or outer edge surface 3C (fillet layer 12) of connection layer 3. A smooth circuit board having no recess therein allows such dust to be easily removed with an adhesive roller for removing the dust. In generally, a circuit board having a recess therein causes such dust to easily collect at corners of the recess, thus preventing the dust from being removed from the corners of the recess with the adhesive roller. In circuit board 1003, insulating coating 11 covering upper surface 1A and side edge surface 1C of upper sub-board 1, upper surface 92A of lower sub-board 2, and outer edge surface 3C of connection layer 3 prevents such dust from entering recess 4. Insulating coating 11, upon having a thickness smaller than 5 μm may have pinholes therein, thus failing to sufficiently cover upper surface 1A and side edge surface 1C of upper sub-board 1, upper surface 92A of lower sub-board 2, and outer edge surface 3C of connection layer 3 (fillet layer 12). Insulating coating 11, upon having a thickness exceeding 30 μm, can hardly follow a shape of circuit board 1003.

In circuit boards 1001 and 1003, both of upper sub-board 1 and lower sub-board 2 may be covered with resin. This prevents dust from being attached onto circuit boards 1001 and 1003.

A thermal expansion coefficient of insulating layer 33 of connection layer 3 at a temperature equal to or lower than the glass transition point ranges preferably from 4 ppm/° C. to 65 ppm/° C., or may be equal to or higher than 4 ppm/° C. and lower than the thermal expansion coefficients of upper sub-board 1 (base layer 111) and lower sub-board 2 (base layer 222).

If that insulating layer 33 has a thermal expansion coefficient lower than 4 ppm/° C., this thermal expansion coefficient may be smaller than the thermal expansion coefficient of component 5 of a semiconductor, such as silicon. If insulating layer 33 has a thermal expansion coefficient exceeding 65 ppm/° C. or exceeding the thermal expansion coefficients of upper sub-board 1 and lower sub-board 2, the deformation of connection layer 3 may cause circuit boards 1001 and 1003 to warp or deform.

A glass transition point of insulating layer 33 of connection layer 3 measured by a dynamic mechanical analysis (DMA) method may be preferably equal to or higher than 185° C. or is higher than the glass transition points of upper sub-board 1 and lower sub-board 2 by a difference more than 10° C. If insulating layer 33 has a glass transition point lower than 185° C. or if the difference is smaller than 10° C., insulating layer 33 may melt before conductive paste 6 starts curing and maintain its shape, consequently causing conductive paste 6 to deform.

Insulating layer 33 of connection layer 3 does not include a core, such as a woven fabric, a nonwoven fabric, or a film. That is, insulating layer 33 has substantially a uniform structure entirely between surfaces 3A and 3B containing thermosetting resin 33A and inorganic filler 33B dispersed in thermosetting resin 33A. Insulating layer 33, upon including a core, prevents wiring patterns 10 and 110 on sub-boards 1 and 2 from being embedded in surfaces 3A and 3B of insulating layer 33 of connection layer 3.

Figure 7:
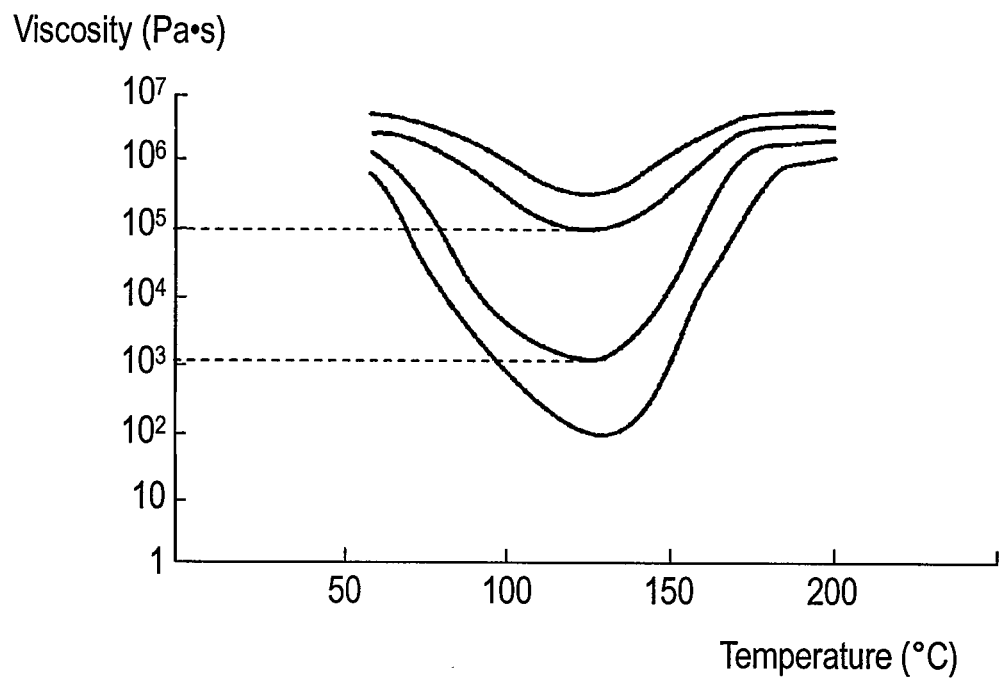
FIG. 7 shows a melt viscosity of the connection layer of the circuit board according to Embodiment 1.

FIG. 7 illustrates the relation between melting viscosities of insulating layer 33 of connection layer 3 and temperatures. As shown in FIG. 7, the melting viscosity of insulating layer 33 changes depending on a temperature, and becomes the lowest melting viscosity at a certain temperature. The lowest melting viscosity of insulating layer 33 may range preferably from 1000 Pa·s to 100000 Pa·s. If the lowest melting viscosity is lower than 1000 Pa·s, the thermosetting resin of insulating layer 33 may significantly flow, thus flowing into recess 4. If the lowest melting viscosity exceeds 100000 Pa·s, insulating layer 33 may fail to adhere onto sub-boards 1 and 2 and prevent wiring patterns 10 and 110 from being sufficiently embedded in surfaces 3A and 3B of insulating layer 33.

Alternatively, insulating layer 33 of connection layer 3 may include colorant so as to mount the board easily and improve light reflectivity.

Upper surface 92A of board 2 may be covered along the shape of upper surface 92A with a removable sheet having a melting temperature lower than the melting temperature of insulating layer 33. This sheet prevents the thermosetting resin of insulating layer 33 of connection layer 3 from flowing during the pressurizing, that is, prevents the thermosetting resin from flowing to recess 4.

Alternatively, insulating layer 33 of connection layer 3 may further contain elastomer dispersed in the thermosetting resin. The elastomer can segregate on the surface of the inorganic filler, and prevents the inorganic filler from flowing.

The elastomer may be acrylic elastomer or thermoplastic elastomer. Specifically, the elastomer may be made of polybutadiene or butadiene series random copolymer rubber or copolymer having a hard segment and a soft segment. The elastomer is contained preferably by 0.2 weight % to 5.0 weight % to the total amount of insulating layer 33, and more preferably by 0.5 weight % to 4.5 weight % to the total amount of insulating layer 33.

Insulating layer 33 of connection layer 3 containing the thermosetting resin, the inorganic filler dispersed in the thermosetting resin, and the elastomer dispersed in the thermosetting resin prevents the inorganic filler from flowing. The inorganic filler has a thermal expansion coefficient about 1/10 smaller than that of the thermosetting resin and thus more hardly thermally expands than thermosetting resin. Thus, connection layer 3 can be placed on sub-boards 1 and 2 while reducing the dimensional variations produced due to a temperature rising of connection layer 3. Sub-boards 1 and 2 adhere onto connection layer 3 while the shapes of boards 1 and 2 are regulated by a pressure due to the pressurizing at a high temperature, thus producing a small internal stress. Then, when the temperatures of sub-boards 1 and 2 return to an ordinary temperature to complete circuit board 15, the internal stress is released, thereby reducing warpage of the circuit board.

Each of upper sub-board 1 and lower sub-board 2 is a resin board, such as a through-hole circuit board or a circuit board having an inner via-hole (IVH) structure. Upper sub-board 1 and lower sub-board 2 may be double-side boards or multi-layer boards. Alternatively, plural sub-boards and connection layers 3 also may be placed alternately.

Figure 8:
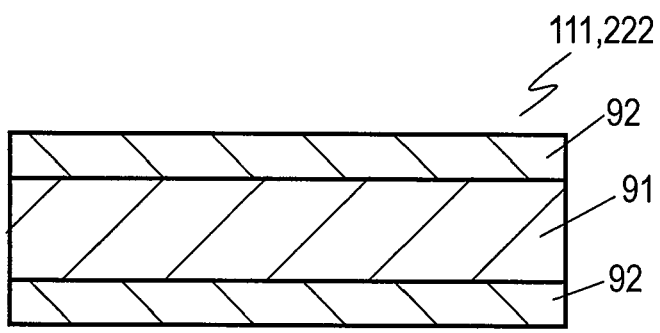
FIG. 8 is a cross-sectional view of another base layer of a sub-board of the circuit board according to Embodiment 1.

Insulating base layers 111 and 222 of upper sub-board 1 and lower sub-board 2 are made of composite material of glass woven fabric and epoxy-base resin. Upper sub-board 1 and lower sub-board 2 according to Embodiment 1 may be made of composite material of thermosetting resin and woven fabric of organic fiber selected from aramid and wholly aromatic polyester or inorganic fiber selected from glass fiber and alumina fiber. Alternatively, sub-boards 1 and 2 may be made of composite material of thermosetting resin and nonwoven fabric of organic fiber selected from p-aramid, polyimide, poly-p-phenylene benzobisthiazole, wholly aromatic polyester, polytetrafluoroethylene (PTFE), poly ether sulfone, and polyetherimide, or inorganic fiber selected from glass fiber and alumina fiber. FIG. 8 is a cross-sectional view of another base layer 333 of each of sub-boards 1 and 2. Base layer 333 is made of composite material that includes synthetic resin film 91 and thermosetting resin layers 92 provided on both surfaces of the synthetic resin film. Resin film 91 is made of at least one of p-aramid, poly-p-phenylene benzobisthiazole, wholly aromatic polyester, polyetherimide, polyetherketoneketone, polyetheretherketone, polyethylene terephthalate, polytetrafluoroethylene, polyethersulphone, polyester terephthalate, polyimide, and polyphenylene sulfide.

Thermosetting resin layers 92 are made of at lease one thermosetting resin selected from epoxy resin, polybutadiene resin, phenol resin, polyimide resin, polyamide resin, and cyanate resin.

Figure 9A:
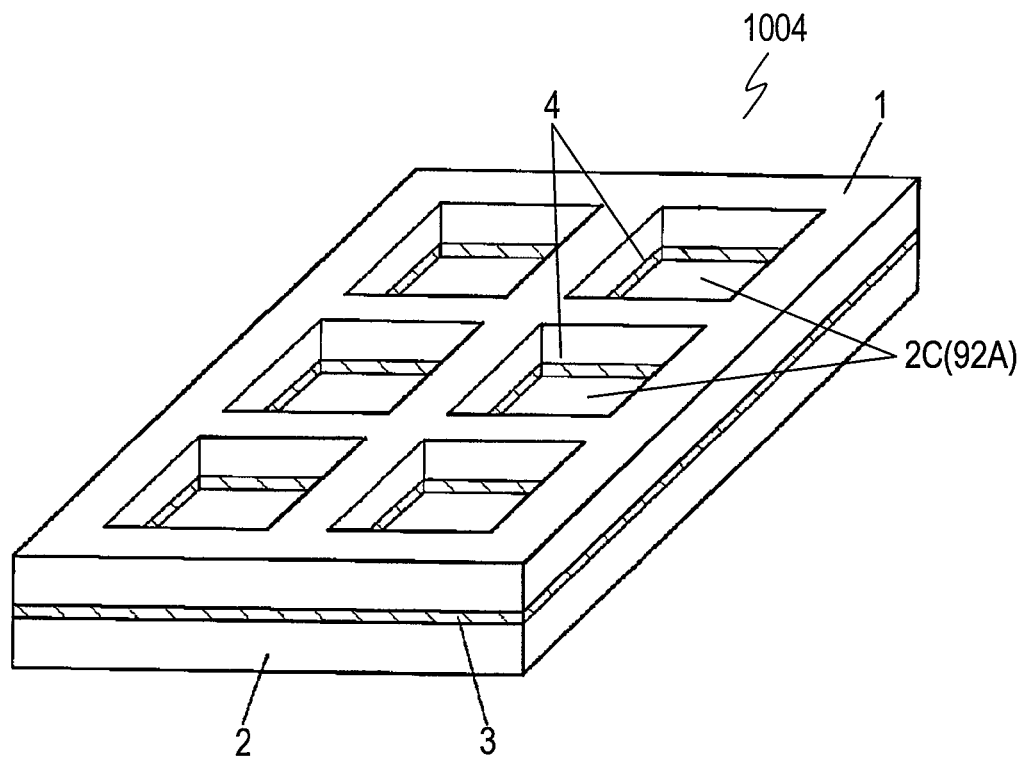
FIG. 9A is a perspective view of a further circuit board according to Embodiment 1.
Figure 9B:
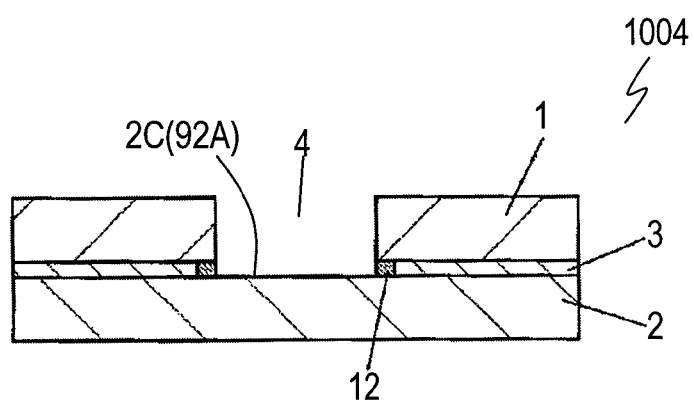
FIG. 9B is a cross-sectional view of the circuit board shown in FIG. 9A.

FIG. 9A is a perspective view of further circuit board 1004 according to Embodiment 1. FIG. 9B is a cross-sectional view of circuit board 1004. In FIGS. 9A and 9B, components identical to those of circuit board 1001 shown in FIG. 1 are denoted by the same reference numerals, and their description will be omitted. In circuit board 1001 shown in FIG. 1, the outer shape of upper sub-board 1 is smaller than that of lower sub-board 2. In circuit board 1004 shown in FIGS. 9A and 9B, the outer shape of upper sub-board 1 is identical to that of lower sub-board 2, and recess 4 provided on exposed portion 2C of upper surface 92A of lower sub-board 2 is entirely surrounded by upper sub-board 1. Fillet layer 12 provided at the edge surface of connection layer 3 surrounds portion 2C of upper surface 92A to prevent the inorganic filler of connection layer 3 from flowing into recess 4.

Figure 9C:
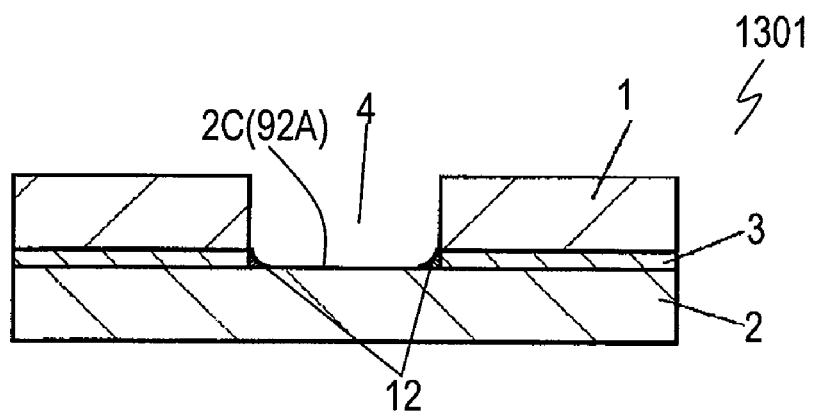
FIG. 9C is a cross-sectional view of a further circuit board according to Embodiment 1.

FIG. 9C is a cross-sectional view of further circuit board 1301 according to Embodiment 1. In FIG. 9C, components identical to those of circuit board 1004 shown in FIG. 9A and FIG. 9B are denoted by the same reference numerals, and their description will be omitted. In circuit board 1301 shown in FIG. 9C, the outer shape of upper sub-board 1 is identical to that of lower sub-board 2, and recess 4 provided on exposed portion 2C of upper surface 92A of lower sub-board 2 is entirely surrounded by upper sub-board 1. Fillet layer 12 provided at the edge surface of connection layer 3 protrudes from the side edge surface of upper sub-board 1. Fillet layer 12 surrounds portion 2C of upper surface 92A to prevent the inorganic filler of connection layer 3 from flowing into recess 4.

Figure 9D:
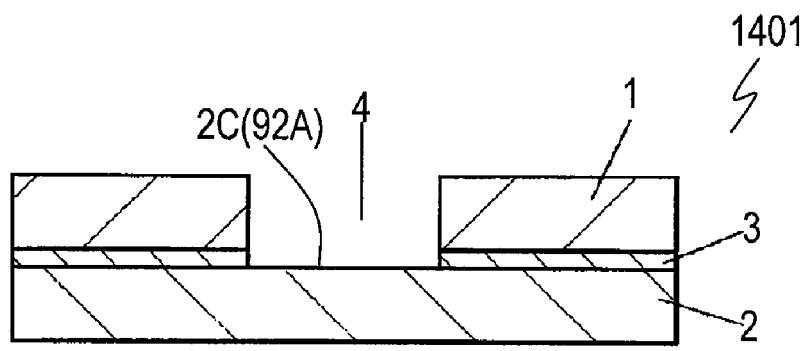
FIG. 9D is a cross-sectional view of a further circuit board according to Embodiment 1.

FIG. 9D is a cross-sectional view of further circuit board 1401 according to Embodiment 1. In FIG. 9D, components identical to those of circuit board 1004 shown in FIGS. 9A and 9B are denoted by the same reference numerals, and their description will be omitted. In circuit board 1401 shown in FIG. 9D, the outer shape of upper sub-board 1 is identical to that of lower sub-board 2, and recess 4 provided on exposed portion 2C of upper surface 92A of lower sub-board 2 is entirely surrounded by upper sub-board 1. In circuit board 1401, fillet layer 12 is not provided at the edge surface of connection layer 3. However, connection layer 3 provides the same effects as the circuit boards according to Embodiment 1.

Exemplary Embodiment 2

Figure 10:
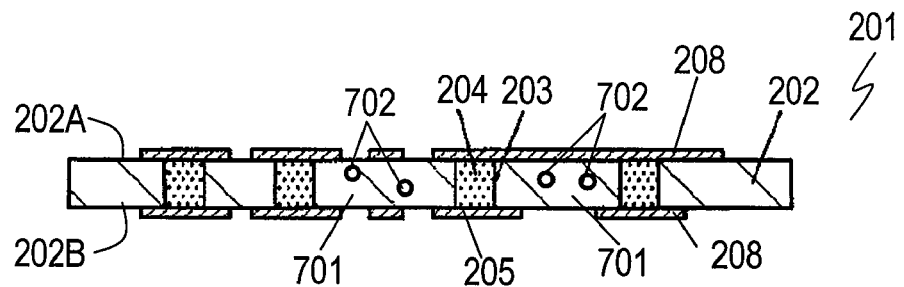
FIG. 10 is a cross-sectional view of a circuit board according to Exemplary Embodiment 2 of the invention.

FIG. 10 is a cross-sectional view of circuit board 201 according to Exemplary of Embodiment 2 of the present invention. Circuit board 201 includes insulating layer 202 having upper surface 202A and lower surface 202B, and via-conductor 205 provided in insulating layer 202. Via-conductor 205 is exposed at upper surface 202A and lower surface 202B. Insulating layer 202 has through-hole 203 therein communicating with upper surface 202A and lower surface 202B. Via-conductor 205 is made of conductive paste 204 filling through-hole 203. Wiring patterns 208 connected to via-conductor 205 is formed on surfaces 202A and 202B of insulating layer 202. Insulating layer 202 contains thermosetting resin 701 and inorganic filler 702 dispersed in thermosetting resin 701. Insulating layer 202 does not include a core, such as a woven fabric, a nonwoven fabric, or a film. Via-conductor 205 is compressed in thickness direction 2001 along which upper surface 202A and lower surface 202B of insulating layer 202 are arranged. Inorganic filler 702 is dispersed in thermosetting resin 701 at 70 weight % to 90 weight % of insulating layer 202. Insulating layer 202 which does not include a core is substantially uniform between surfaces 202A and 202B while containing thermosetting resin 701 and inorganic filler 702 dispersed in thermosetting resin 701.

Next, a method of manufacturing circuit board 201 will be described below. FIGS. 11A to 11G are cross-sectional views of circuit board 201 for illustrating the method of manufacturing circuit board 201.

Figure 11A:
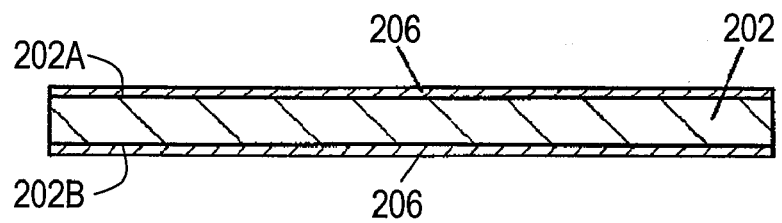
FIG. 11A is a cross-sectional view of the circuit board according to Embodiment 2 for illustrating a method of manufacturing the circuit board.

First, as shown in FIG. 11A, removable films 206 are attached onto upper surface 202A and lower surface 202B of insulating layer 202. Removable film 206 is made of resin, such as polyethylene terephthalate (PET).

Figure 11B:
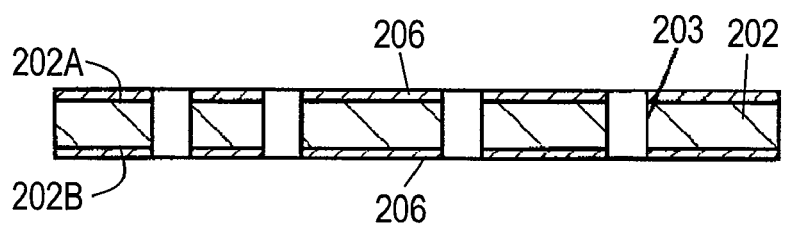
FIG. 11B is a cross-sectional view of the circuit board according to Embodiment 2 for illustrating the method of manufacturing the circuit board.

Next, as shown in FIG. 11B, through-hole 203 passes through insulating layer 202 and removable film 206 is formed by, for example, laser.

Figure 11C:
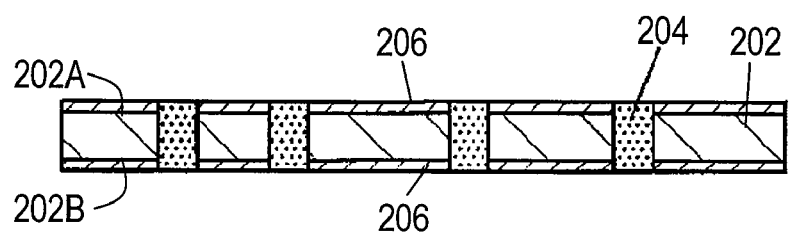
FIG. 11C is a cross-sectional view of the circuit board according to Embodiment 2 for illustrating the method of manufacturing the circuit board.

Next, as shown in FIG. 11C, conductive paste 204 fills through-hole 203. Conductive paste 204 contains conductive particles, such as metal particles. Removable film 206 covers surfaces 202A and 202B so that conductive paste 204 does not remain on surfaces 202A and 202B of insulating layer 202.

Figure 11D:
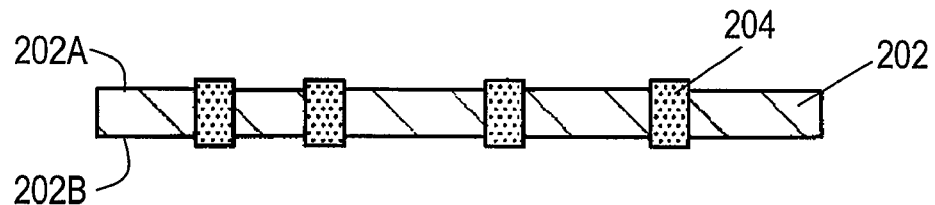
FIG. 11D is a cross-sectional view of the circuit board according to Embodiment 2 for illustrating the method of manufacturing the circuit board.
Figure 11E:
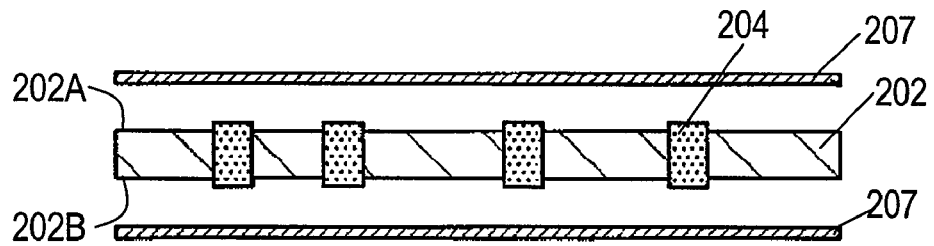
FIG. 11E is a cross-sectional view of the circuit board according to Embodiment 2 for illustrating the method of manufacturing the circuit board.
Figure 11F:
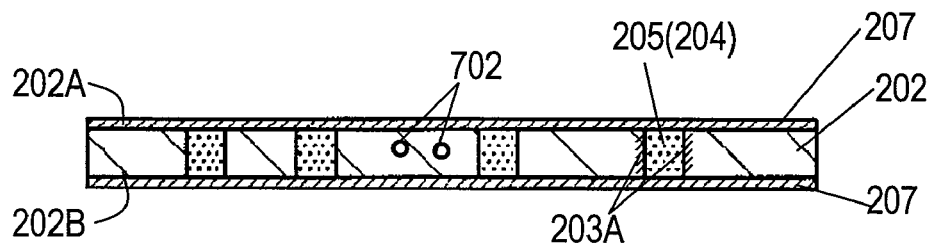
FIG. 11F is a cross-sectional view of the circuit board according to Embodiment 2 for illustrating the method of manufacturing the circuit board.

Then, as shown in FIG. 11D, removable film 206 is peeled from surfaces 202A and 202B. As a result, conductive paste 204 protrudes from surfaces 202A and 202B of insulating layer 202 by a height identical to the thickness of removable film 206. As shown in FIG. 11E, conductive foil 207s made of conductive material, such as metal, are prepared. Then, as shown in FIG. 11F, conductive foils 207 is placed on surfaces 202A and 202B of insulating layer 202.

Next, conductive foils 207 are heated and pressurized toward surfaces 202A and 202B of insulating layer 202, thereby adhering conductive foil 207 to insulating layer 202. The heating and pressurizing compresses conductive paste 204 protruding from surfaces 202A and 202B to be flush with surfaces 202A and 202Bm thereby providing via-conductor 205. This compression provides the conductive particles in conductive paste 204 with a higher density, accordingly causing the conductive particles to contact each other securely. This process connects electrically between conductive foils 207 and via-conductor 205 (conductive paste 204).

In circuit board 201, inorganic filler 702 is dispersed in thermosetting resin 701 at a high density ranging from 70 weight % to 90 weight % of insulating layer 202. This structure prevents inorganic filler 702 of insulating layer 202 from flowing even when conductive foils 207 are heated and pressurized. Thus, via-wall 203A made of inorganic filler 702 and thermosetting resin 701 is provided on a wall surface of through-hole 203. Via-wall 203A prevents conductive paste 204 filling through-hole 203 from flowing to insulating layer 202, thus connecting stably between via-conductor 205 and conductive foil 207. Via-wall 203A prevents conductive paste 204 from flowing to insulating layer 202 even when conductive foils 207 are heated and pressurized. Thus, via-conductor 205 is prevented from deforming, and maintains the shape of through-hole 203 to have a shape close to a cylindrical shape or a circular truncated cone shape.

Figure 11G:
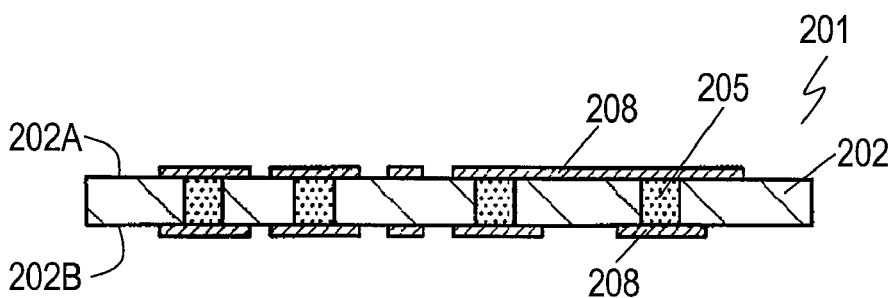
FIG. 11G is a cross-sectional of the circuit board according to Embodiment 2 for illustrating the method of manufacturing the circuit board.

Then, as shown in FIG. 11G, conductive foils 207 are patterned to provide wiring patterns 208 on surfaces 202A and 202B of insulating layer 202, thereby completing circuit board 201.

Inorganic filler 702 of insulating layer 202 is preferably made of at least one of silica, alumina, and barium titanate. Inorganic filler 702 preferably has a particle diameter ranging from 1 μm to 15 μm. If the inorganic filler is contained in insulating layer 202 by an amount smaller than 70%, inorganic filler 702 is thinly distributed. Thus, when conductive foils 207 are heated and pressurized to cause insulating layer 202 and thermosetting resin 701 to flow, inorganic filler 702 flows simultaneously. If the inorganic filler is contained in insulating layer 202 by an amount exceeding 90%, insulating layer 202 does not securely adhere onto conductive foil 207.

The conductive particles contained in conductive paste 204 are preferably made of one of copper, silver, gold, palladium, bismuth, tin, and the alloy thereof, and has a particle diameter ranging from 1 μm to 20 μm.

Inorganic filler 702 has an average particle diameter larger than the average particle diameter of the conductive particles of conductive paste 204.

Insulating layer 202 may further contain elastomer dispersed in thermosetting resin 701 in addition to inorganic filler 702. The elastomer can segregate on the surface of inorganic filler 702 to prevent inorganic filler 702 from flowing.

The elastomer may be any of acrylic elastomer and thermoplastic elastomer. Specifically, the elastomer is made of polybutadiene or butadiene series random copolymer rubber or copolymer having a hard segment and a soft segment. The elastomer is contained preferably by 0.2 weight % to 5.0 weight % to insulating layer 202.

Insulating layer 202 may further contain colorant. In this case, the assembly and the light reflectivity are improved.

Figure 12:
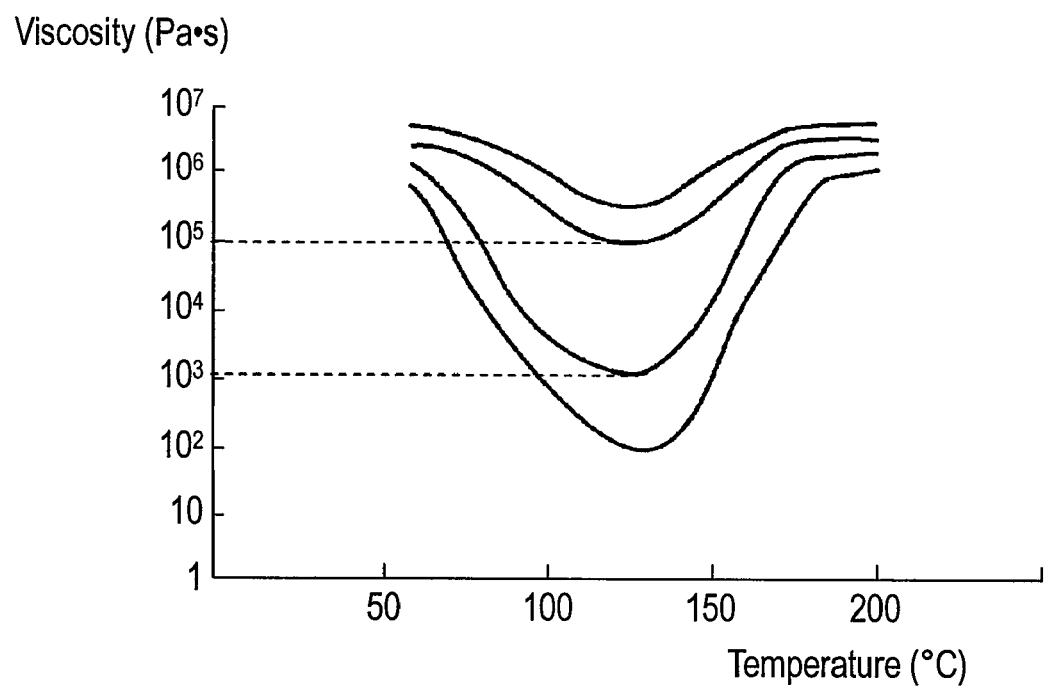
FIG. 12 shows a melt viscosity of a connection layer of the circuit board according to Embodiment 2.

FIG. 12 illustrates the relation between the melting viscosity of insulating layer 202 and a temperature. As shown in FIG. 12, insulating layer 202 melts depending on a temperature to have a viscosity change, and has the lowest melting viscosity at a certain temperature. The lowest melting viscosity of insulating layer 202 ranges from 1000 Pa·s to 100000 Pa·s. If the lowest melting viscosity is lower than 1000 Pa·s, thermosetting resin 701 of insulating layer 202 may flow excessively. If the lowest melting viscosity exceeds 100000 Pa·s, insulating layer 202 may fail to adhere to conductive foil 207.

Figure 13:
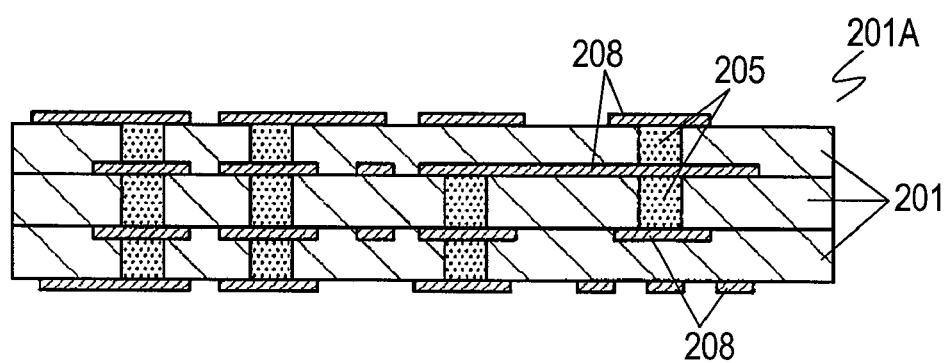
FIG. 13 is a cross-sectional view of the circuit board according to Embodiment 2.

FIG. 13 is a cross-sectional view of another circuit board 201A according to Embodiment 2. In FIG. 13, components identical to those of circuit board 201 shown in FIG. 10 are denoted by the same reference numerals, and their description will be omitted. Circuit board 201A includes circuit boards 201 stacked on each other.

Figure 14:
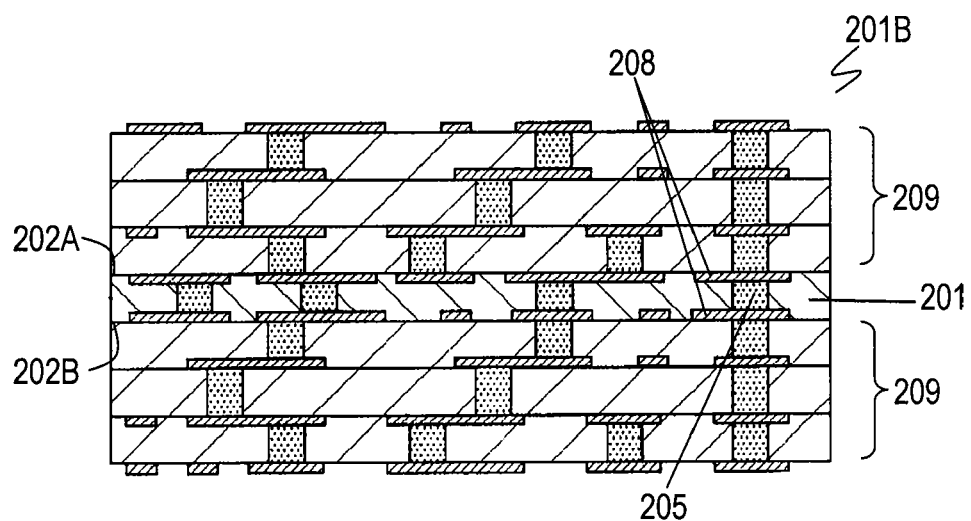
FIG. 14 is a cross-sectional view of the circuit board according to Embodiment 2.
Figure 15:
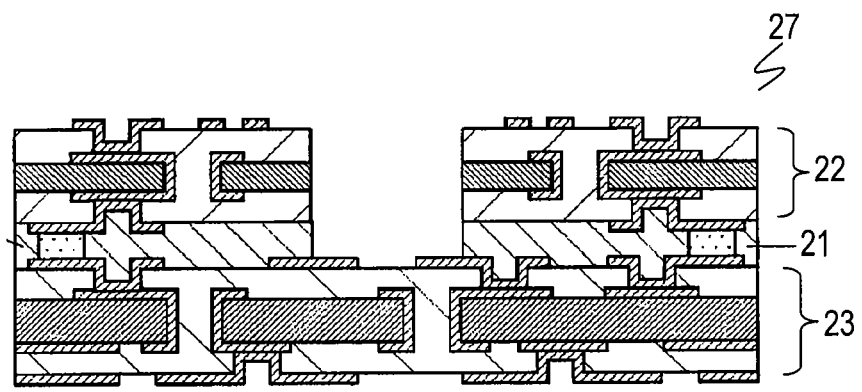
FIG. 15 is a cross-sectional view of a conventional circuit board.
Figure 16A:
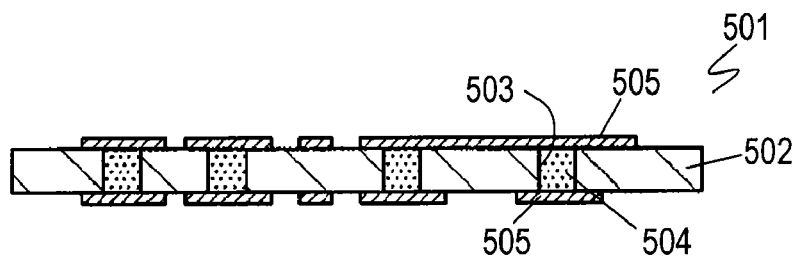
FIG. 16A is a cross-sectional view of another conventional circuit board.
Figure 16B:
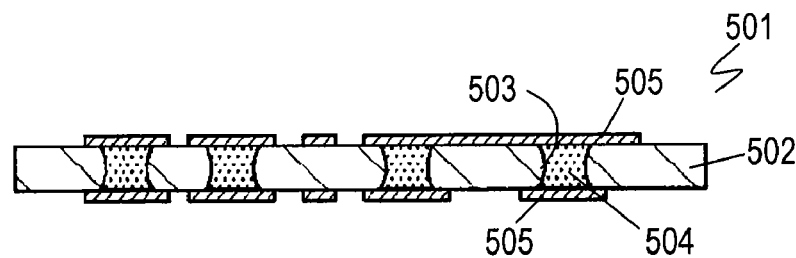
FIG. 16B is a cross-sectional view of the circuit board shown in FIG. 16A.

FIG. 14 is a cross-sectional view of further circuit board 201B according to Embodiment 2. In FIG. 14, components identical to those of circuit board 201 shown in FIG. 10 are denoted by the same reference numerals, and their description will be omitted. Circuit board 201B includes circuit board 201 shown in FIG. 1, and further includes sub-boards 209 provided on surfaces 202A and 202B. Sub-boards 209 may include base layer 219 made of different resin from the base layer of insulating layer 202 of circuit board 201.

Sub-board 209 is a resin board, such as a through-hole circuit board or a circuit board having an inner-via-hole (IVH) structure, and may be a double-sided board or a multilayer board. Alternatively, sub-boards 209 and circuit boards 201 may be stacked alternately.

According to Embodiments 1 and 2, terms indicating directions, such as "upper surface", "lower surface", "upper", "lower", and "directly above" merely indicate relative directions depending on the positions of constituting members, and do not indicate absolute directions, such as a vertical direction.

Industrial Applicability

A circuit board according to the present invention can connect sub-boards densely, and is useful as a package board for providing a small size, a small thickness, a small weight, high resolution, and more functions for a personal computer, a digital camera, or a portable telephone.

The invention claimed is:

1. A circuit board comprising:
a lower sub-board including
a first base layer having an upper surface, and
a first wiring pattern provided on the upper surface of the first base layer;
an upper sub-board including
a second base layer having a lower surface, and
a second wiring pattern provided on the lower surface of the second base layer;
a connection layer including
an insulating layer having a lower surface and an upper surface, the lower surface of connection layer being joined to the upper surface of the first base layer, the upper surface of connection layer being situated on the lower surface of the second base layer, and
a via-conductor passing through the insulating layer, the via-conductor being connected to the first wiring pattern and the second wiring pattern, wherein
the upper sub-board and the connection layer expose a portion of the upper surface of the lower sub-board,
the insulating layer includes thermosetting resin, inorganic filler dispersed in the thermosetting resin, and elastomer dispersed in the thermosetting resin, and
a fillet layer covering an outer periphery of an edge surface of the connection layer at the exposed portion of the upper surface of the lower sub-board, said fillet layer continuously extending from a top surface of said insulating layer to a bottom surface of said insulating layer,
wherein the fillet layer contains the thermosetting resin of the insulating layer and does not contain the inorganic filler.

2. The circuit board according to claim 1,
wherein the connection layer further has an edge surface which is positioned between the upper surface and the lower surface of the connection layer and which is directly connected to the upper surface and the lower surface of the connection layer,
wherein the upper sub-board further has an edge surface directly connected to the lower surface of the second base layer and the upper surface of the connection layer,
said circuit board further comprising an insulating coating covering the edge surface of the connection layer and the edge surface of the upper sub-board.

3. The circuit board according to claim 2, wherein the insulating coating contains antistatic agent.

4. The circuit board according to claim 1,
wherein the connection layer further has an edge surface which is positioned between the upper surface and the lower surface of the connection layer and which is directly connected to the upper surface and the lower surface of the connection layer,
said circuit board further comprising an insulating coating covering the fillet layer and the edge surface of the upper sub-board.

5. The circuit board according to claim 4, wherein the insulating coating contains antistatic agent.

6. The circuit board according to claim 1, wherein the insulating layer does not include a core.

7. The circuit board according to claim 1, wherein
the via-conductor is made of conductive paste,
the conductive paste is compressed in a thickness direction of the insulating layer, and
a shape of the through-hole is maintained while the conductive paste is compressed in the thickness direction of the insulating layer.

8. The circuit board according to claim 1, wherein the inorganic filler is made of at least one of silica, alumina, and barium titanate.

9. The circuit board according to claim 1, wherein the elastomer is one of acrylic elastomer and thermoplastic elastomer, and the elastomer is contained in the insulating layer by 0.2 weight % to 5.0 weight %.

10. The circuit board according to claim 1, wherein the thermosetting resin of the insulating layer is epoxy resin.

11. The circuit board according to claim 1, wherein the insulating layer has a glass transition point higher than glass transition points of the first base layer and the second base layer by a difference more than 10° C.

12. The circuit board according to claim 1, wherein the insulating layer contains colorant.

13. The circuit board according to claim 1, wherein the insulating layer contains 70 weight % to 90 weight % of the inorganic filler.

14. The circuit board according to claim 1, wherein the upper sub-board does not cover the portion of the upper surface of the lower sub-board.

15. The circuit board according to claim 1, wherein the connection layer does not cover the portion of the upper surface of the lower sub-board.

16. The circuit board according to claim 1, wherein said insulating layer and said fillet layer have substantially uniform thickness.

* * * * *

UNITED STATES PATENT AND TRADEMARK OFFICE
CERTIFICATE OF CORRECTION

PATENT NO.        : 8,253,033 B2
APPLICATION NO.   : 12/514383
DATED             : August 28, 2012
INVENTOR(S)       : Tadashi Nakamura et al.

It is certified that error appears in the above-identified patent and that said Letters Patent is hereby corrected as shown below:

On Title page 2, Item [56], References Cited, FOREIGN PATENT DOCUMENTS:
Please delete the following duplicate references:

"JP    06-268345A     9/1994
JP    2001-244368A    9/2001
JP    2002-208763A    7/2002
JP    2004-253774A    9/2004"

Signed and Sealed this
Thirteenth Day of November, 2012

David J. Kappos
*Director of the United States Patent and Trademark Office*